United States Patent [19]

Tam et al.

[11] Patent Number: 4,740,971
[45] Date of Patent: Apr. 26, 1988

[54] TAG BUFFER WITH TESTING CAPABILITY

[75] Inventors: Aloysius T. Tam, Sunnyvale; Thomas S. Wong, San Jose; Jim L. Michelsen, Santa Clara; David F. Naren, Cupertino; David Wang, Palo Alto, all of Calif.

[73] Assignee: Advanced Micro Devices, Inc., Sunnyvale, Calif.

[21] Appl. No.: 835,078

[22] Filed: Feb. 28, 1986

[51] Int. Cl.⁴ .................... G11C 29/00; G01R 31/28
[52] U.S. Cl. ........................................ 371/21; 371/10; 371/51; 365/200
[58] Field of Search .............. 371/21, 51, 25, 10; 365/200, 201; 324/73 R, 73 AT; 364/200 MS File, 900 MS File

[56] References Cited

U.S. PATENT DOCUMENTS

| | | | |
|---|---|---|---|
| 3,599,146 | 8/1971 | Weisbecker | 365/200 X |
| 3,789,204 | 1/1974 | Barlow | 371/51 |
| 3,982,111 | 9/1976 | Lerner | 371/21 |
| 4,195,770 | 4/1980 | Benton | 371/21 |
| 4,319,355 | 3/1982 | Mollier | 371/21 |
| 4,417,162 | 11/1983 | Keller | 307/473 |
| 4,483,003 | 11/1984 | Beal | 371/51 |
| 4,577,294 | 3/1986 | Brown | 371/10 X |
| 4,601,034 | 7/1986 | Sridhar | 371/21 X |

OTHER PUBLICATIONS

Texas Instruments Data Sheet, "TMS 2150 JL Cache Address Comparator", Mar. 1982, pp. 106–111.
Fujitsu Data Sheet, "MB78024, 608-Bit Buffer Address Array".

*Primary Examiner*—Jerry Smith
*Assistant Examiner*—Robert W. Beausoliel
*Attorney, Agent, or Firm*—Patrick T. King; Stephen C. Durant; J. Vincent Tortolano

[57] ABSTRACT

A tag buffer having built-in testing capabilities is disclosed. In a single-chip, integrated-circuit design which includes a SRAM, a parity generator and checker, and a comparator, a method and capability of testing the functionality of the SRAM and parity components is defined. For an embodiment in which the SRAM component includes a redundancy scheme for replacing a defective memory array row, a test for determining whether a redundant row has been used is also provided.

16 Claims, 4 Drawing Sheets

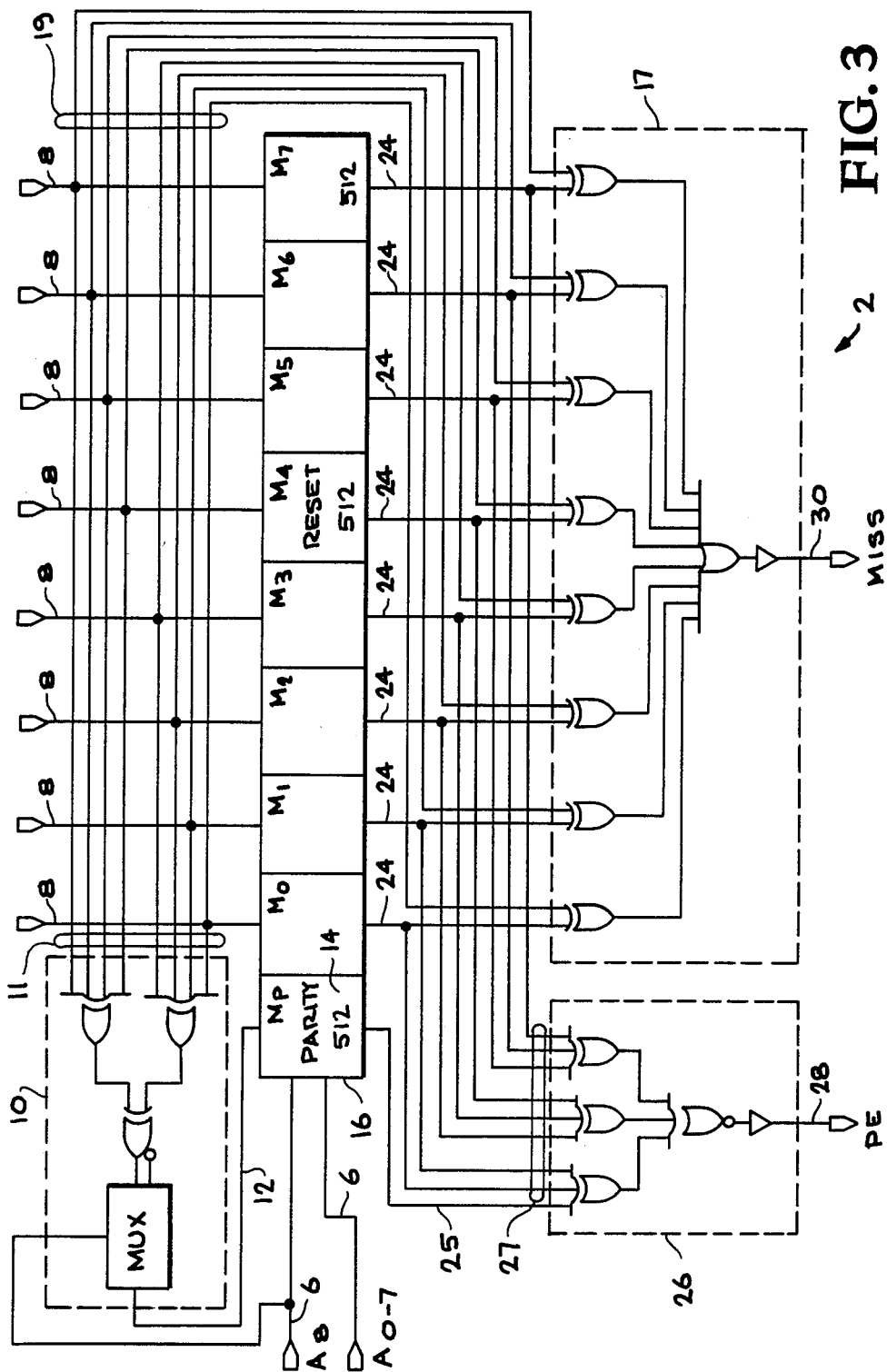

TRUTH TABLE

| INPUTS | | | OUTPUTS | | DESCRIPTION |
|---|---|---|---|---|---|
| $\overline{S}$ | $\overline{W}$ | $\overline{R}$ | PE | MISS | |
| H | X | X | L<br>HZ | L<br>HZ | DISABLED<br>(AM10465/100469)<br>(TTL-VERSION) |
| L | H | H | H = P.E.<br>L = NO P.E. | H = MISS<br>L = MATCH | COMPARE |
| L | H | L | L | H | RESET * |
| L | L | H | L | H | WRITE |
| L | L | L | L | H | NO OP |

I
II
III
IV
V

X = DON'T CARE
H = HIGH LEVEL
L = LOW LEVEL
HZ = HIGH IMPEDANCE
P.E. = PARITY ERROR
* ONE DATA BIT (512 × 1 OF RAM CELLS) IS RESET TO ZERO.
THE OTHER SEVEN DATA BITS MAY CHANGE TO UNDETERMINED STATE (HIGH OR LOW)

FIG. 4

TRUTH TABLE - TEST FACILITIES

| | INPUT | | | | OUTPUT | | DESCRIPTION |
|---|---|---|---|---|---|---|---|
| | A8 | S̄ | W̄ | R̄ | D0-7 | PE | MISS | |
| I | X | L | H | H | Dk=L ALL OTHERS= 3RD | H = PE L = NO PE | Qk | Qk FALLS THROUGH MISS OUTPUT |
| II | X | L | H | 3RD | X | Q-PARITY | H=MISS L=MATCH | Q-PARITY FALLS THROUGH PE OUTPUT |
| III | 3RD | L | L | H | X | X | X | WRITE EVEN PARITY FOR BOTTOM HALF OF PE ARRAY |
| IV | X | 3RD | X | X | X | X | H=REPAIRED L=VIRGIN | CHECK FOR RE-PAIRED ROW |

3RD = THIRD STATE (Vcc + 1/2 ø)
X = DON'T CARE
H = HIGH
L = LOW
P.E. = PARITY ERROR

FIG. 5

TAG BUFFER WITH TESTING CAPABILITY

BACKGROUND OF THE INVENTION

1. Field of the Invention

The present invention generally relates to buffer circuitry and, more particularly, to a tag buffer integrated circuit with testing capabilities.

2. Description of the Related Art

A buffer is a circuit device which is basically a synchronizing element between two different forms of other circuit devices. A tag buffer is a special type of buffer used in an electrical system architecture to store informative "tags." Tags are used to give an indication to the overall system as to where data or instructions are located.

A tag buffer includes several components: a storage device, such as a random access memory (RAM), generally having address, data and control signal inputs and outputs; a comparator circuit; a parity generator; and a parity checker or detector. FIG. 1 indicates a typical tag buffer system architecture, e.g., as commercially available in the Am10469/100469 parts manufactured by Advanced Micro Devices, Inc., Sunnyvale, Calif.

A common use for a tag buffer is in an integrated circuit memory system. A typical system is shown in FIG. 2. As depicted, a computer system may have both a main memory and a cache memory. The cache memory is a small but very fast supplementary computer memory between the main memory and the central processing unit (CPU). The system is generally designed to use the cache to give the effect of a larger and faster main memory. The cache memory is transparent to the user whose program need not address the cache. The cache is generally controlled to be loaded with the addressed word plus words from adjacent memory locations. Since programs are usually sequential in nature, such a block of words is very likely to be entirely in the cache. In this manner, often-used data or instructions can be in the cache, relieving the CPU from constantly having to access the main memory. Hence, operations can be performed much faster.

Tag buffers are used both in address translation cache and data cache applications. The key function of a tag buffer is to compare the internal data bits of a memory with external data bits. An equality of the internal and external data is then confirmed or denied by an output signal from the tag buffer.

Referring to FIG. 1, a tag buffer might have nine internal data bits and one output bit. For example, address tags are stored in the tag buffer storage device. The external data, viz., a tag word on inputs D, are compared to the internal data. Each tag word is composed of eight bits of data and one bit of parity (in practice, the word can be expanded to any desired width). An output of a digital logic HIGH (MISS signal) from the comparator component could be used to indicate that the word sought by the CPU is not in the cache; similarly, an output of a digital logic LOW (MATCH or HIT signal) could be used to indicate the word is in the cache. Parity is generated internally (eliminating system parity generation). During a COMPARE cycle, the eight bits of data are monitored for odd parity by the parity checker.

It is difficult to test the functionality and switching characteristics of a device such as the tag buffer which includes a multi-bit storage component because its content cannot be read out through the input/output pins. Therefore, a tag buffer which includes a designed-in method for testing and built-in test facilities is needed.

SUMMARY OF THE INVENTION

It is an object of the present invention to provide a tag buffer having integrated test facilities.

It is another object of the present invention to provide a tag buffer system which is capable of testing its own functionality using commercially available testing devices.

It is yet another object of the present invention to provide a method for testing the functionality of data and parity bit memory locations in a tag buffer.

It is a further object of the present invention to provide a forced-parity-error functionality testing method for a tag buffer.

It is also an object of the present invention to provide a signature mechanism in a tag buffer, testing whether an original memory row has been replaced by a redundant memory row.

In a broad aspect, the present invention provides a method of testing the content functionality of each of the memory locations in a tag buffer having a plurality of inputs and a plurality of outputs. A predetermined pattern of data bits is written into the memory array. The data inputs are then disabled. The data input to one particular location is enabled and the content of that location is read. A comparison to the known pattern tells whether that location is functioning according to the operational specifications of the tag buffer. Each location, including the locations used to store the parity bit of data, can be tested accordingly.

In an alternative embodiment, the present invention is also designed with a "signature" function; i.e., the ability to test whether any addressed rows are replaced by redundant rows.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

FIG. 3 is a schematic logic diagram of the present invention as shown in FIG. 1;

FIG. 4 is a table which defines the logic level input and output parameters during the various operational cycles of the present invention as shown in FIG. 3; and FIG. 5 is a table which defines the logic level input and output conditions during the various test facility modes of the present invention as shown in FIG. 3.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable.

Figure 1:
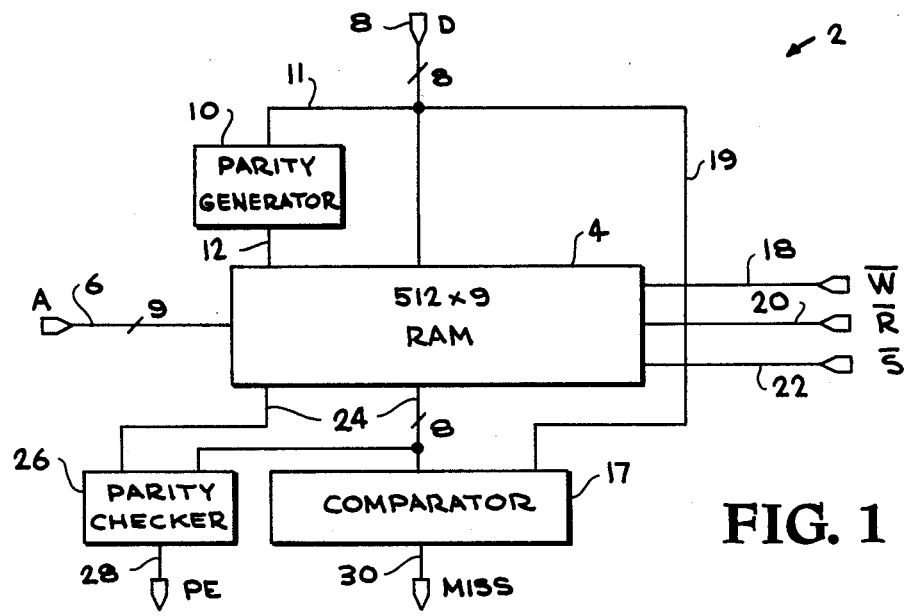
FIG. 1 is a schematic block diagram of a typical tag buffer system architecture as is applicable to the present invention.

As shown in FIG. 1 and in FIG. 3, the tag buffer 2 includes a storage array 4. In the Am10469/100469 commercial embodiments, the array 4 is a static RAM (SRAM) having 512 rows and 9 columns for a total of 4608 bit locations. In the context of the tag buffer storage, this can be thought of as 512 words which represent "tags" identifying data or instructions. A typical SRAM includes an address decoder, buffers, and control signal and reset function logic circuits. To facilitate the description of the present invention, these conventional subcomponents of the SRAM, being structurally and functionally well known in the art, have been omitted from the FIGURES and description.

The device operates with digital logic in which a digital logic HIGH or LOW signal is defined by a functional product specification as particular voltage levels referenced to a system biasing voltage level, Vcc.

The RAM 4 has nine address inputs 6 for receiving an address comprising a series of digital logic bits, $A_{0-8}$. The nine address inputs are decoded to select one of 512 memory locations; e.g., row 16 of FIG. 3, which has nine bits, used to identify a specific location for writing digital logic data, D, into, or comparing data out of, that specific location.

The RAM 4 also has eight data inputs 8 for receiving the data bits $D_{0-7}$ which make up an eight bit word. For the purpose of describing this embodiment, an application of the commercial embodiment in an address translation function is described. Hence, the eight bit word on inputs 8 would be an address "tag" stored in the RAM cells, $M_0$–$M_7$.

Coupled to each of the data inputs 8 is a comparator circuit 17 and a parity generator circuit 10 via discrete electrical connection lines designated 19 and 11, respectively. During a COMPARE cycle, the comparator 17 compares the eight bits of data stored in the addressed memory array 4 row 16 with the eight bits of input data $D_{0-7}$ for equality.

To ensure the quality of the tag words, a parity bit is stored along with each tag word. The parity generator 10 of the present embodiment generates odd parity; if there is an even number of "ones" in the data inputs 8, the parity will be designated by a HIGH at the parity generator output 12. The parity generator output 12 is input to the parity bit location 14 of the particular row 16 of the RAM array 4 being addressed.

Three other signals complete the inputs to the RAM 4. The WRITE ENABLE signal, /W, input 18 in the present embodiment must be at a digital logic LOW signal level to cause data to be written into the location selected by the address inputs 6. When /W is a digital logic LOW signal, data on inputs 8 will be written into the array 4 at the location specified by the address on inputs 6. To read data out, /W has to be a digital logic HIGH signal.

The RESET signal, /R, input 20 in the present embodiment must be at a LOW signal level to reset a dedicated data bit (512×1 of the RAM cells) to zero.

The CHIP SELECT signal, /S, input 22 when set LOW in the present embodiment activates the tag buffer 2 for a COMPARE, WRITE or RESET activity. A HIGH on this input will disable the tag buffer 2 and force the outputs in the present embodiment to a LOW, allowing for vertical expansion of the tag buffer.

The RAM 4 has nine outputs 24. Eight of the outputs 24 are coupled via discrete electrical connection lines to the comparator circuit 17; these outputs 24 correspond to the data bits $D_{0-7}$. The other output 25 is coupled from the selected parity bit location 14 to an input of parity checker circuit 26. The eight data bit outputs 24 are also coupled to discrete inputs 27 of the parity checker circuit 26.

The tag buffer 2 has two outputs. The first output 28 is from the parity checker 26. The output signal, PE, will be HIGH if the nine bits of data read out from the RAM array 4 do not constitute odd parity during a COMPARE cycle. In other words, the parity checker detects if the eight bits of data stored in row 16 and the one bit of parity out of location 14 in the RAM 4 are consistent with the odd parity implementation in the present embodiment. The output 28, PE, will be HIGH if there is a parity error during a COMPARE cycle (even parity) or LOW if there is no parity error (odd parity).

The other output 30 is from the comparator 17. The output signal, MISS, will be a HIGH if there is a mismatch between the data-in, $D_{0-7}$, and the data-out from the selected storage location during a COMPARE cycle. The MISS signal at output 30 will be a LOW when both the data in and stored data are identical. The parity bit in the RAM array 4 is not compared.

There are three operational modes, COMPARE, WRITE and RESET. A table defining the signal conditions for these modes is shown in FIG. 4.

In the COMPARE mode, the eight bits of data input, $D_{0-7}$, e.g., an address tag, are compared with the content of an addressed memory location for equality. The nine address inputs, $A_{0-8}$, define each memory location in the array 4. In this mode, /W and /R are HIGH and /S is LOW. If the eight bits of data, $D_0$–$D_7$, inputs 8 are exactly the same as the eight bits of data out of the addressed memory location, e.g., row 16, $M_0$–$M_7$, comparator output 30 (defined as the MISS signal) will be LOW. If not identical, the MISS signal at output 30 will be HIGH. If the eight bits of data and the one bit of parity 14 out of the RAM 4 are not consistent with the odd parity implementation, the parity checker output 28, signal PE, will be HIGH.

Figure 2:
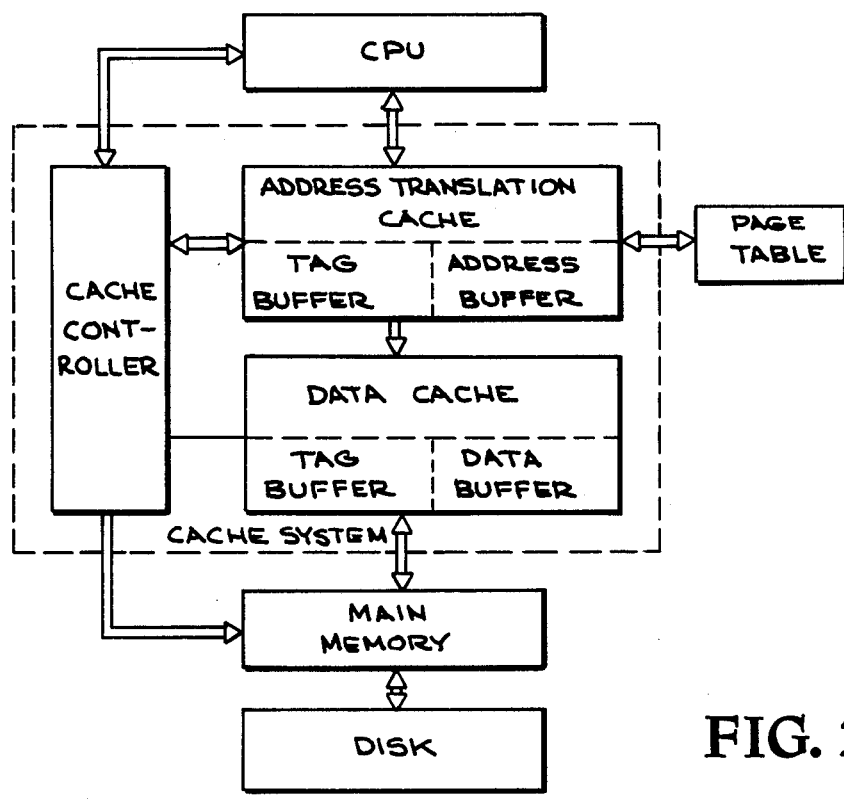
FIG. 2 is a schematic block diagram of a typical cache system in which a tag buffer is commonly used.

In the WRITE mode, eight bits of data, e.g., from a cache system such as shown in FIG. 2, and the one bit of parity are written into the RAM array 4 when both /S and /W are set LOW and /R is set HIGH. The MISS output 30 is forced to a HIGH (i.e., MISS output is associated with the output enable of the data cache, providing or not providing CPU access). PE is forced LOW.

In the RESET mode, with /R set LOW, /S set LOW and /W set HIGH, a dedicated section of the array for data storage is reset to LOW. The ninth section, for parity storage, cannot be reset. The PE signal is forced LOW during this mode. The MISS output 30 is forced HIGH. The nine address inputs 6 do not need to be stable during a RESET cycle.

The logic diagram for this embodiment of the invention is shown in FIG. 3. The design of the individual components of this embodiment of the tag buffer 2 makes provision for testing the functionality of various components of the tag buffer 2. As will be obvious to a person skilled in the art, the algorithmic functions and conditions defined by the tables in FIGS. 4 and 5 can be implemented in many different circuit designs; e.g., emitter coupled logic (ECL), transistor-transistor logic (TTL), metal-oxide-semiconductor (MOS) logic, complementary MOS (CMOS) logic, or combined technologies (BiMOS). The limitation is that the implementing circuitry conforms to the logic diagram of FIG. 3 and performs the algorithmic functions defined by the tables of FIGS. 4 and 5. FIG. 5, sets out the conditions for each of four test modes.

In the first method of testing (FIG. 5, line I), each RAM 4 data cell location, $M_0$–$M_7$ is tested. A known pattern of digital data is written into the RAM 4 from the test equipment in accordance with the WRITE cycle algorithmic parameters as defined in FIG. 4, line IV.

The data pattern written into the RAM array 4 can be all digital 1's, all 0's, or a mixed pattern. Each memory cell can be checked for functionality when set to either representative signal level.

CHIP SELECT, /S, is set to a LOW, /W and /R to a HIGH, putting the tag buffer into the COMPARE mode. The first location address (or any particular row of memory cells to be tested) is input on $A_{0-8}$. The first data bit location to be tested at that address, $D_n$, is activated by putting a LOW on the input 8. All other inputs 8 to that address are raised to a third state, "3RD STATE." In the commercial embodiment, 3RD STATE=$V_{cc}+\frac{1}{2} V_{BE}$, where $V_{BE}$ is the base-emitter voltage of the individual transistors used in the individual memory cells. Thus all of the RAM locations at that address except the bit location to be tested for functionality are disabled. As a result of the circuitry logic, instead of providing the operational MISS signal, the output signal from the comparator output 30 will be the content of the tested location. If functional, the bit which falls out, $Q_n$, will be the same as the bit of known data from the previously written pattern. This sequence is repeated for each of the memory locations in the RAM array 4, testing each of the locations or any individual location which is functionally suspect.

In other words, when any data input is in the 3RD STATE, the corresponding array cell is disabled. Referring to FIG. 3, for example, to read the content of location $M_7$ (specified by $A_0$–$A_8$), $D_0$–$D_6$ are set into the 3RD STATE and $D_7$ is set into the LOW state. The data previously written into $M_7$ appears on the comparator output 30.

In the second test mode, the functionality of the parity circuitry and parity bit locations 14 in the RAM 4 is tested. A predetermined data pattern is written into the RAM 4 (as described above for the first test mode). In this test mode, a pattern is written into the RAM 4 which will cause the parity generator 10 to put a data bit representing odd parity into each of the parity bit locations 14, such as $M_p$ depicted in FIG. 3.

The input conditions to test the parity bit location 14 (defined by address $A_0$–$A_8$) are set forth in line II of the table in FIG. 5. CHIP SELECT, /S, is set to a LOW and WRITE ENABLE, /W, is set to a HIGH. Rather than setting the RESET, /R, input 20 to a LOW which would put the device into the RESET mode or to a HIGH for a COMPARE mode (FIG. 4, lines III and II, respectively), /R is set to the 3RD STATE.

Instead of providing the operational signal output from the parity checker 26, the odd parity bit stored in the addressed location 14 falls out through the parity checker output 28. Referring briefly to FIG. 3, for example: when the input conditions are set, the data bit in $M_p$, in the row specified by $A_0$–$A_8$, passes through the parity checker output 28. By toggling the address inputs 6, each location can be checked.

As stated above, in the commercial embodiment used for an example of the best mode in this specification, under normal operation the parity generator 10 generates an odd parity bit which is stored in $M_p$. It is also desirable to test the parity circuitry and each parity bit location 14 by forcing a parity error, viz., writing a data bit representing even parity into $M_p$. The input conditions for a third test mode are defined in line III in the table of FIG. 5. The predetermined test pattern in the array is the same as for the second test mode, viz., any pattern which generates odd parity for the parity bit locations 14. Once /S, /W, and /R are set to put the device into a WRITE cycle (compare with FIG. 4, line IV), input $A_8$ is set to the 3RD STATE and even parity is written into the bottom half of $M_p$. This is then manifested by a PE signal HIGH appearing at the output 28 of the parity checker 26.

Although not always the case, it is common for storage arrays 4 to include a redundancy scheme; i.e., redundant rows which can be used to repair rows having defects which would affect the performance of the tag buffer 2. In the commercial embodiment of the present invention, four redundant rows which can functionally replace up to four defective rows are provided. The user may wish to determine whether any particular address accesses a row which is an original array row or directs the array to operate from one of the redundant rows.

In the fourth test mode, the commercial embodiment of the present invention provides a "signature" test to make such a determination. The input parameters for this fourth test mode are set forth in line IV of FIG. 5. When /S is set to the 3RD STATE, a HIGH on the comparator output 30 indicates that the row specified by $A_0$ to $A_8$ has been replaced by a redundant row. Again, by changing the row address bits, each row can be tested accordingly.

Using the present invention, such testing as described in each mode can be performed using commercially available test equipment such as the XINCOM 5588H. Said testing can be programmed to be performed sequentially or individually.

The foregoing description of the preferred embodiments of the present invention has been presented for purposes of illustration and description. It is not intended to be exhaustive or to limit the invention to the precise form disclosed. Obviously, many modifications and variations will be apparent to practitioners skilled in this art. Similarly, any method steps described might be interchangeable with other steps in order to achieve the same result. The described embodiment was chosen in order to best explain the principles of the invention and its practical application, to thereby enable others skilled in the art to understand the invention for various embodiments and with various modifications as are suited to the particular use contemplated. It is intended that the scope of the invention be defined by the claims appended hereto and their equivalents.

What is claimed is:

1. In circuit device, including an array of respective memory locations arranged in respective columns and respective rows such that each respective memory location is included in only one respective column and in only one respective row, said respective memory locations being adapted for storing digital data signals, said digital signals being represented by either a first or a second signal level, each respective memory location having an input and an output, said device further having control signal inputs and a single output, a method for testing the functionality of each of said respective memory locations, comprising the steps of:

writing a predetermined pattern of respective digital data signals to respective memory locations of at least one respective row of said array;

providing to each respective memory location of the at least one respective row, except for a memory location under test, a disabling signal represented by a third signal level such that each respective memory location of the at least one respective row, except for the memory location under test, becomes disabled;

reading from the respective memory location under test respective digital data signals stored at that respective memory location;

comparing the respective digital data signal stored at the respective memory location under test to a respective digital data signal written to the respective memory location under test; and providing a single output signal indicating whether the respective digital data signal stored at the respective memory location under test is an equivalent of the respective digital data signal written to the respective memory location under test.

2. The method as set forth in claim 1, wherein said step of providing to each respective memory location comprises:

setting the input of said memory location under test to said first signal level.

3. The method as set forth in claim 2, wherein said step of writing includes writing a predetermined pattern of digital data signals to respective memory locations of each respective row of the array; and wherein said method further comprises:

repeating said steps following said writing step for each respective memory location to be tested.

4. The method as set forth in claim 2, wherein said first predetermined signal level is a digital logic LOW signal level and said second signal level is a digital logic HIGH signal level.

5. The method as set forth in claim 2, in a circuit device further having redundant memory locations used to substitute for defective respective memory locations, a method of testing said device to determine whether a particular memory location being accessed is one of said plurality of memory locations or one of said redundant memory locations, comprising the steps of:

following said step of providing to each respective memory location, providing a control input signal, which is set to said first level when said device is activated, to said third level, such that said signal output will be at said second signal level only when a particular location being addressed is one of said redundant locations.

6. The method as set forth in claim 1, wherein each respective row includes a respective parity bit memory location, said circuit device further including a parity generator circuit having an input coupled to each of said plurality of respective memory location inputs and an output coupled to said parity bit memory locations for transmitting thereto a digital data signal indicative of parity of said pattern of data bits, and a parity checker circuit having an input coupled to each of said plurality of respective memory location outputs and to said plurality of respective memory location inputs for generating a parity error indication signal at a parity checker circuit output, and wherein said respective location under test is a respective parity bit memory location, wherein said step of writing includes writing a predetermined pattern of digital data signals to respective memory locations of each respective row of the array, and wherein:

said writing step further comprises writing a predetermined pattern of digital data signals to said plurality of respective memory locations such that said parity generator generates an odd parity signal to each of said respective parity bit locations;

said step of providing to each respective memory location comprises setting a control input signal, which is set to said first digital logic signal level when said plurality of respective memory locations are reset, to a third signal level; and said reading step comprises reading said parity bit location for an odd parity indicating signal at said parity checker circuit output.

7. The method as set forth in claim 6, further comprising repeating said steps following said writing step for each said parity bit memory locations.

8. The method as set forth in claim 6, further comprising:

said step of providing to each respective memory location comprises setting a bit of control input signal, which is used to address a particular row, to a third signal level such that a digital data signal indicative of even parity is stored in said parity bit location; and said reading step comprises setting said control signal inputs such that said digital data signal indicative of even parity is transmitted to said parity checker circuit output.

9. The method as set forth in claim 8, further comprising repeating said steps following said writing step for each of said parity bit memory locations.

10. The method as set forth in claim 1, further comprising repeating each of said steps after said step of writing for each of said respective memory cells in the respective row.

11. The method as set forth in claim 10, wherein said circuit device further comprises a parity generator circuit having first input terminals coupled discretely to said memory cell data inputs and an output terminal coupled to an additional one of said respective columns of memory cell locations, said circuit device further including a parity checker circuit with an input terminal coupled to an output terminal from said additional one of said respective columns and an output terminal indicative of parity error and further comprising:

writing a predetermined pattern of data into said respective memory locations such that said parity generator circuit will write a data bit representative of no parity error in said pattern into each memory location in said additional one of said respective columns;

setting a control input signal used to put said device into a RESET mode to a third signal level;

transmitting said data bit representative no-parity-error to said parity checker output terminal; and comparing said transmitted data bit to said data bit representative of no-parity-error.

12. The method as set forth in claim 10, wherein said circuit device further comprises a parity generator circuit having first input terminals coupled discretely to said memory cell data inputs and an output terminal coupled to an additional one of said respective columns of memory cell locations, said circuit device further including a parity checker circuit with an input terminal coupled to an output terminal from said additional one of said respective columns and an output terminal indicative of parity error and wherein said parity generator circuit has a second input terminal coupled to one of said address input signal terminals, further comprising:
  writing a predetermined pattern of data into said respective memory locations such that said parity generator circuit will write a data bit representative of no parity error in said pattern into each memory location in said additional one of said respective columns;
  setting said control input signals to put said device into said WRITE mode;
  providing to said second address input terminal an input signal at said third signal level such that a data bit representative of parity error is written into said additional one of said cells;
  transmitting said data bit representative of parity to said parity checker output terminal; and
  comparing said transmitted data bit to a data bit representative of parity error.

13. The method as set forth in claim 11, wherein said data bit representative of no-parity-error is representative of odd-parity in said pattern.

14. The method as set forth in claim 12, wherein said data bit representative of parity error is representative of even-parity in said pattern.

15. In a tag buffer integrated circuit device wherein a first signal level defines a first digital logic state and a second signal level defines a second digital logic state, having discrete digital logic control signal inputs for establishing CHIP ENABLE, WRITE, COMPARE and RESET mode of operation, said device further having a digital data memory storage component having a plurality of memory cells arrayed in plural-cell rows, each said row being accessible via digital logic address signal inputs to said device, each individual cell in each row having a discrete data input and output and each row having an additional cell for storing a bit of digital data representing the parity of a pattern of data on said data inputs, said additional cell having an input and an output, said device further having a parity generator component having a first set of discrete inputs coupled to said discrete digital data inputs, an input coupled to one of said digital logic address signal inputs, and an output coupled to said additional cell, said device further having a parity checker component having an input coupled to said output of said additional cell and an output for providing a digital signal indicative of even or odd parity, said device further having a comparator component having a first set of discrete inputs coupled to said discrete digital data inputs, a second set of discrete inputs coupled to said outputs of the corresponding individual cells coupled to said same discrete digital data inputs in each of said rows, and an output for providing a digital signal indicative of the equality of a data pattern on said data inputs and the content of an addressed row, a method for testing the functionality of said additional cells, comprising the steps:
  setting said control signal inputs to digital logic levels such that said WRITE mode is established;
  setting said digital logic address signal input coupled to said parity generator input to a third signal level such that a data bit indicative of even parity is stored in said additional cell;
  setting said control signal inputs to digital logic levels such that said COMPARE mode is established; and
  comparing said parity checker output signal to said signal indicative of even parity for equality.

16. In a digital logic tag buffer integrated circuit device wherein a first signal level defines a first digital logic state and a second signal level defines a second digital logic state, having discrete digital logic control signal inputs for establishing CHIP ENABLE, WRITE, COMPARE and RESET modes of operation, said device further having a digital data memory storage component having a plurality of memory cells arrayed in plural-cell rows, each said row being accessible via digital logic address signal inputs to said device, each individual cell in each row having a discrete data input and output, said storage component having at least one redundant row for replacing any row which is defective said device further having a comparator component having a first set of discrete inputs coupled to said discrete digital data inputs, a second set of discrete inputs coupled to said outputs of the corresponding individual cells coupled to said same discrete digital data inputs in each of said rows, and an output for providing a digital signal indicative of the equality of a data pattern on said data inputs and the content of an addressed row, a method for testing whether a particular address accesses one of said plural-cell rows or said redundant row, comprising the steps of:
  setting said control signal input used to establish said CHIP ENABLE mode to a third signal level;
  transmitting a first signal level to said comparator output if said address accesses one of said plural cell rows and a second signal level to said comparator output if said address accesses said redundant row.

* * * * *